(12) United States Patent
Bai et al.

(10) Patent No.: US 9,673,229 B2
(45) Date of Patent: Jun. 6, 2017

(54) ARRAY SUBSTRATE, METHOD FOR MANUFACTURING THE SAME AND DISPLAY APPARATUS

(71) Applicants: BOE TECHNOLOGY GROUP CO., LTD., Beijing (CN); BEIJING BOE DISPLAY TECHNOLOGY CO., LTD., Beijing (CN)

(72) Inventors: Jinchao Bai, Beijing (CN); Yao Liu, Beijing (CN); Liangliang Li, Beijing (CN); Zhaohui Hao, Beijing (CN); Liang Sun, Beijing (CN)

(73) Assignees: BOE TECHNOLOGY GROUP CO., LTD., Beijing (CN); BEIJING BOE DISPLAY TECHNOLOGY CO., LTD., Beijing (CN)

( * ) Notice: Subject to any disclaimer, the term of this patent is extended or adjusted under 35 U.S.C. 154(b) by 0 days.

(21) Appl. No.: 15/177,795

(22) Filed: Jun. 9, 2016

(65) Prior Publication Data

US 2016/0293637 A1    Oct. 6, 2016

Related U.S. Application Data

(62) Division of application No. 14/794,240, filed on Jul. 8, 2015, now Pat. No. 9,412,761, which is a division
(Continued)

(30) Foreign Application Priority Data

Mar. 31, 2012    (CN) .......................... 2012 1 0093375

(51) Int. Cl.
*H01L 29/04*    (2006.01)
*H01L 29/10*    (2006.01)
(Continued)

(52) U.S. Cl.
CPC .......... *H01L 27/124* (2013.01); *G02F 1/1345* (2013.01); *G02F 1/1368* (2013.01);
(Continued)

(58) Field of Classification Search
CPC ............... H01L 27/124; H01L 27/1259; H01L 27/1288; H01L 2924/0002; H01L 27/1214;
(Continued)

(56) References Cited

U.S. PATENT DOCUMENTS 8,592,237 B2    11/2013 Lee et al.
2007/0153206 A1    7/2007 Lim et al.
(Continued)

FOREIGN PATENT DOCUMENTS

CN    10175051 A    11/2007
CN    101414085 A    4/2009
(Continued)

OTHER PUBLICATIONS

International Preliminary Report on Patentability issued Oct. 1, 2014; PCT/CN2012/084470.
(Continued)

*Primary Examiner* — Sonya D McCall Shepard
(74) *Attorney, Agent, or Firm* — Ladas & Parry LLP

(57) ABSTRACT

An array substrate, a method for manufacturing the same and a display apparatus are provided. The array substrate comprises: a substrate (1); a common electrode (2) and a pixel electrode (10) sequentially formed on the substrate (1) and insulated from each other; a thin film transistor comprising a gate electrode (4), an active layer (7), a source electrode (8a) and a drain electrode (8b), wherein the drain electrode (8b) is electrically connected with the pixel electrode (10); a common electrode line (5) disposed in a same layer as the gate electrode (4); and an insulating layer (3)
(Continued)

between the gate electrode (4) and the common electrode (2), wherein the common electrode (2) is connected with the common electrode line (5) through a through hole in the insulating layer (3).

8 Claims, 2 Drawing Sheets

Related U.S. Application Data of application No. 13/976,498, filed as application No. PCT/CN2012/084470 on Nov. 12, 2012, now Pat. No. 9,146,431.

(51) Int. Cl.
*H01L 31/00* (2006.01)
*H01L 27/12* (2006.01)
*G02F 1/1368* (2006.01)
*G02F 1/1362* (2006.01)
*G02F 1/1345* (2006.01)
*G02F 1/1333* (2006.01)
*H01L 23/31* (2006.01)
*G02F 1/1343* (2006.01)

(52) U.S. Cl.
CPC .. *G02F 1/133345* (2013.01); *G02F 1/136227* (2013.01); *G02F 1/136286* (2013.01); *H01L 23/3171* (2013.01); *H01L 27/1214* (2013.01); *H01L 27/1218* (2013.01); *H01L 27/1248* (2013.01); *G02F 2001/134318* (2013.01); *G02F 2201/121* (2013.01); *G02F 2201/123* (2013.01); *G02F 2201/40* (2013.01)

(58) Field of Classification Search
CPC ............. H01L 27/1248; H01L 27/1255; H01L 27/127; H01L 27/1222; H01L 2924/00; H01L 29/66969; H01L 27/12; H01L 29/41733
USPC ................................. 257/59; 438/30; 349/52
See application file for complete search history.

(56) References Cited

U.S. PATENT DOCUMENTS

| | | |
|---|---|---|
| 2007/0284627 A1 | 12/2007 | Kimura |
| 2009/0101908 A1 | 4/2009 | Kwack |
| 2010/0007836 A1 | 1/2010 | Lee |
| 2010/0187532 A1 | 7/2010 | Nagano et al. |

FOREIGN PATENT DOCUMENTS

| | | |
|---|---|---|
| CN | 101625491 A | 1/2010 |
| CN | 102654703 A | 9/2012 |
| KR | 20020002054 A | 1/2002 |

OTHER PUBLICATIONS

First Chinese Office Action dated Oct. 21, 2013; Appln. No. 201210093375.8.
Chinese Rejection Decision dated May 21, 2014; Appln. No. 201210093375.8.
USPTO Corrected Notice of Allowability dated Jun. 22, 2015 in connection with U.S. Appl. No. 13/976,498.
USPTO NFOA dated Oct. 2, 2014 in connection with U.S. Appl. No. 13/976,498.
USPTO NFOA dated Dec. 19, 2014 in connection with U.S. Appl. No. 13/976,498.
USPTO RR dated Aug. 21, 2015 in connection with U.S. Appl. No. 14/794,240.
USPTO NFOA dated Nov. 4, 2015 in connection with U.S. Appl. No. 14/794,240.
USPTO NOA mailed Mar. 11, 2016 in connection with U.S. Appl. No. 14/794,240.

ARRAY SUBSTRATE, METHOD FOR MANUFACTURING THE SAME AND DISPLAY APPARATUS

TECHNICAL FIELD

Embodiments of the invention relate to an array substrate, a method for manufacturing the same and a display apparatus comprising the array substrate.

BACKGROUND

TFT-LCD of ADSDS (ADvanced Super Dimension Switch, abbreviated as ADS) mode is widely used in the liquid crystal display field due to its advantages of high resolution, high transmittance, low power consumption, wide viewing angle, high aperture ratio, low chromatic aberration, free of push Mura, etc. In the TFT-LCD of ADS mode, a multi-dimensional electric field is formed with both an electric field generated at edges of slit electrodes in a same plane and an electric field generated between a slit electrode layer and a plate-like electrode layer, so that liquid crystal molecules at all orientations, which are located directly above the electrodes or between the slit electrodes in a liquid crystal cell, can be rotated. In this way, the work efficiency of liquid crystal can be enhanced, the light transmittance can be increased, and thus the image quality of the TFT-LCD can be improved.

At present, an array substrate of the ADS mode TFT-LCD may be formed by a plurality of patterning processes, and each of the patterning processes may further comprises a film forming process, an exposing process, a developing process, an etching process, a stripping process and so on. The etching process may be a dry etching process or a wet etching process.

FIG. 1 is a schematic structural view of an array substrate of a conventional ADS mode TFT-LCD. As shown in FIG. 1, a common electrode 2 and a gate electrode 4 are provided in a same layer, and a patterning process for forming the common electrode 2 and a patterning process for forming the gate electrode 4 are performed sequentially. The common electrode 2 and the gate electrode 4 may be electrically connected to each other if residuals of the common electrode 2 or the gate electrode 4 are generated in the corresponding patterning process, in this case, a short circuit (Gate-Common Short) occurs between the common electrode 2 and the gate electrode 4 and the properties of the thin film transistor will be severely deteriorated. In order to prevent such short circuit phenomenon, the distance between the common electrode 2 and the gate electrode 4 is generally increased. However, when the distance between the common electrode 2 and the gate electrode 4 is increased, the width of a black matrix (BM) used to prevent light leakage has to be increased, the light transmitting region of each pixel unit has to be decreased, and thus the aperture ratio of each pixel unit will be reduced.

SUMMARY OF THE INVENTION

According to an embodiment of the invention, an array substrate is provided. The array substrate comprises: a substrate; a common electrode and a pixel electrode sequentially formed on the substrate and insulated from each other; a thin film transistor comprising a gate electrode, an active layer, a source electrode and a drain electrode, wherein the drain electrode is electrically connected with the pixel electrode; and a common electrode line disposed in a same layer as the gate electrode. The array substrate further comprises an insulating layer between the gate electrode and the common electrode to isolate the gate electrode from the common electrode, and the common electrode is connected with the common electrode line through a first through hole in the insulating layer.

According to another embodiment of the invention, a method for manufacturing the array substrate is provided. The method comprises the procedures of: forming the common electrode line, the common electrode and the thin film transistor on the substrate, wherein the thin film transistor comprises the gate electrode, the source electrode and the drain electrode; and forming the insulating layer between the gate electrode and the common electrode to isolate the gate electrode from the common electrode.

According to still another embodiment of the invention, a display apparatus comprising the above described array substrates is provided.

According to embodiments of the invention, since the insulating layer with high light transmittance is additionally provided between the common electrode and the gate electrode, the common electrode is completely isolated from the gate electrode even if residuals are generated during the etching processes for forming the common electrode and the gate electrode and the short circuit can not be generated between the common electrode and the gate electrode. In this case, the horizontal distance between the common electrode and the gate electrode can be shortened. According to embodiments of the invention, the horizontal distance between the common electrode and the gate electrode can be shorten to be as small as 0.5-0.8 times of the horizontal distance between the common electrode and the gate electrode in the conventional technology. Therefore, the width of the black matrix (BM) for preventing light leakage can be decreased, the light transmitting region of each pixel unit can be increased, and the aperture ratio of each pixel unit can be improved.

BRIEF DESCRIPTION OF THE DRAWINGS

In order to clearly illustrate the technical solution of the embodiments of the invention, the drawings of the embodiments will be briefly described in the following; it is obvious that the described drawings are only related to some embodiments of the invention and thus are not limitative of the invention.

DESCRIPTION OF THE EMBODIMENTS

Figure 1:
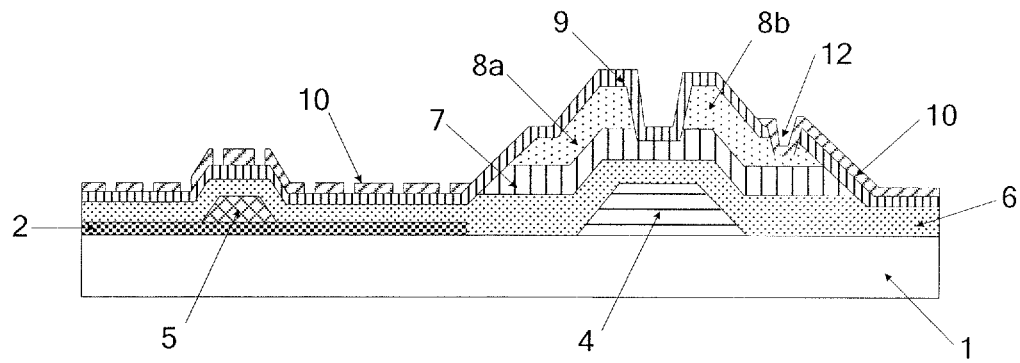
FIG. 1 is a schematic structural view of an array substrate in a conventional ADS mode TFT-LCD.

In order to make objects, technical details and advantages of the embodiments of the invention apparent, the technical solutions of the embodiment will be described in a clearly and fully understandable way in connection with the drawings related to the embodiments of the invention. It is obvious that the described embodiments are just a part but not all of the embodiments of the invention. Based on the described embodiments herein, those skilled in the art can obtain other embodiment(s), without any inventive work, which should be within the scope of the invention.

Embodiments of the invention provide an array substrate, a method for manufacturing the array substrate and a display apparatus comprising the array substrate.

The array substrate comprises: a substrate 1; a common electrode 2 and a pixel electrode 10 sequentially formed on the substrate 1 and insulated from each other, wherein the pixel electrode 10 has slits formed therein; a thin film transistor comprising a gate electrode 4, an active layer 7, a source electrode 8a and a drain electrode 8b, wherein the drain electrode 8b and the pixel electrode 10 are electrically connected to each other; and a common electrode line 5 disposed in a same layer as the gate electrode 4. The array substrate further comprises an insulating layer 3 provided between the gate electrode 4 and the common electrode 2 for isolating the gate electrode 4 from the common electrode 2. The common electrode 2 is connected with the common electrode line 5 through a through hole in the insulating layer 3.

The method for manufacturing the array substrate comprises a procedure for forming the common electrode line 5, the common electrode 2 and the thin film transistor comprising the gate electrode 4, the source electrode 8a and the drain electrode 8b. The method further comprises a procedure for forming the insulating layer 3 located between the gate electrode 4 and the common electrode 2. The insulating layer 3 is used to isolate the gate electrode 4 from the common electrode 2. The common electrode 2 is connected with the common electrode line 5 through the through hole in the insulating layer 3.

The display apparatus comprises the array substrate as described above. The display apparatus may be any products or components with display function such as a liquid crystal panel, an electronic paper, an OLED panel, a liquid crystal television, a liquid crystal display, a digital photo frame, a mobile phone, a tablet PC and so on.

Figure 6:
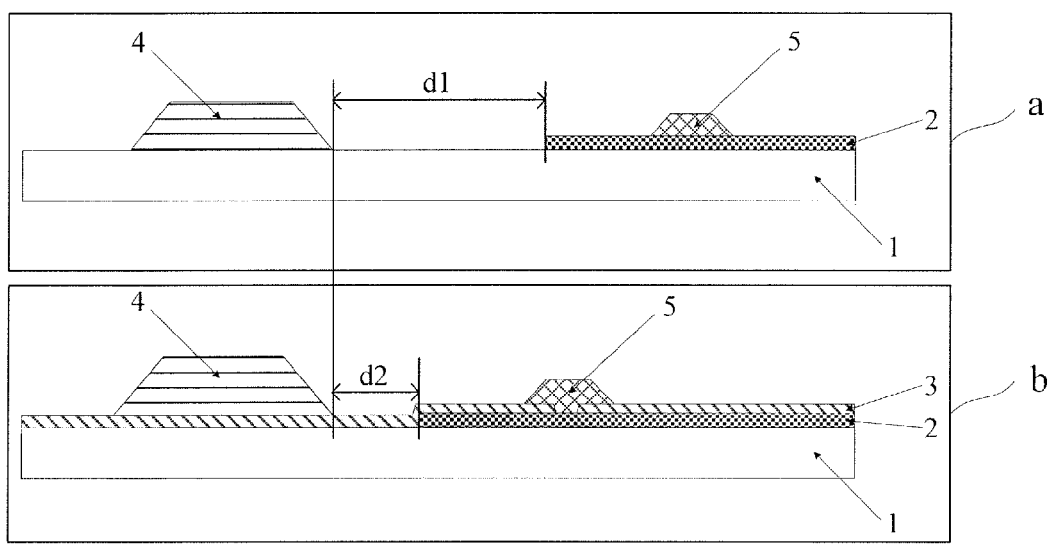
FIG. 6 is a schematic view for comparing the distance between a common electrode and a gate electrode in the embodiments of the invention with the distance between the common electrode and the gate electrode in a conventional technology.

FIG. 6 is a schematic view for comparing the distance between the common electrode 2 and the gate electrode 4 in the embodiments of the invention with the distance in a conventional technology. In FIG. 6, a is a schematic view illustrating the distance d1 between the common electrode 2 and the gate electrode 4 in the conventional technology, and b is a schematic view illustrating the distance d2 between the common electrode 2 and the gate electrode 4 in the embodiments of the invention, wherein d2/d1 is about 0.5~0.8. It can be seen from FIG. 6 that: since the insulating layer 3 is provided between the common electrode 2 and the gate electrode 4 in the array substrate according to embodiments of the invention, the distance d2 between the common electrode 2 and the gate electrode 4 is shortened compared with the distance d1 in the conventional technology. Therefore, the aperture ratio of the pixel unit can be increased in the embodiments of the invention.

Embodiment 1

Figure 2:
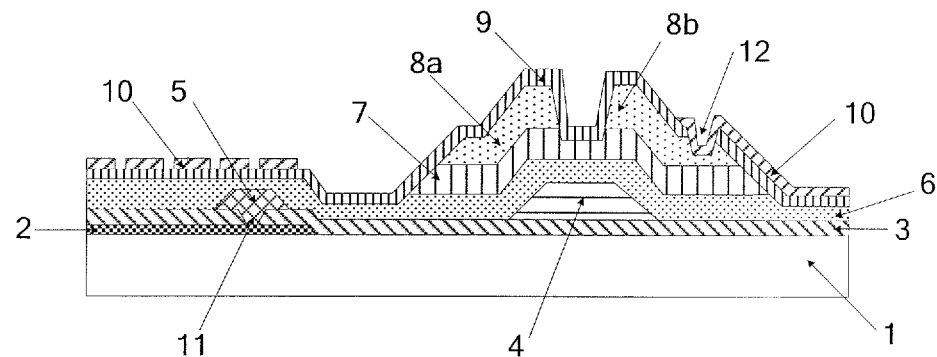
FIG. 2 is a schematic structural view of an array substrate in an embodiment 1 of the invention.

As shown in FIG. 2, in the present embodiment, the array substrate comprises: a substrate 1; a common electrode 2 formed on the substrate 1; an insulating layer 3 covering the common electrode 2 and the substrate 1, wherein a portion of the insulating layer 3 covering the common electrode 2 has a first through hole 11; a gate electrode 4 and a common electrode line 5 formed on the insulating layer 3, wherein the common electrode line 5 and the gate electrode 4 are disposed in a same layer, the common electrode line 5 is provided on the first through hole 11, and the common electrode line 5 is connected with the common electrode 2 through the first through hole 11; a gate electrode protection layer (i.e., a gate insulating layer) 6, wherein the gate electrode protection layer 6 completely covers the gate electrode 4, the common electrode line 5 and the insulating layer 3; an active layer 7 formed on the gate electrode protection layer 6; a source electrode 8a and a drain electrode 8b formed on the active layer 7; a passivation layer 9 covering the source and drain electrodes 8a and 8b and the gate electrode protection layer 6, wherein a second through hole 12 is formed in a portion of the passivation layer 9 covering the drain electrode 8b; and a pixel electrode 10 formed on the passivation layer 9, wherein the pixel electrode 10 has slits formed therein and the pixel electrode 10 is electrically connected to the drain electrode 8b through the second through hole 12. It can be seen form FIG. 2 that the common electrode 2 and the pixel electrode 10 are insulated from each other, and the insulating layer 3 is located between the gate electrode 4 and the common electrode 2 to isolate the gate electrode 4 from the common electrode 2.

The first through hole 11 and the second through hole 12 are preferably formed by a dry etching process.

The substrate 1 may be made of glass. Both of the insulating layer 3 and the passivation layer 9 may be made of insulating materials with high light transmittance. For example, the insulating layer 3 and the passivation layer 9a may be made of a single layer formed of any one of $SiN_x$, $SiO_x$ and $SiO_xN_y$, a multi-layer formed of any combination of $SiN_x$, $SiO_x$ and $SiO_xN_y$, a single layer formed of any one of polyamide and epoxy resin, a multi-layer formed of a combination of polyamide and epoxy resin, or a single layer or multi-layer formed of other insulating materials. The source electrode 8a, the drain electrode 8b, the gate electrode 4 and the common electrode line 5 may be made of a single layer formed of molybdenum, aluminum, aluminum-neodymium alloy, tungsten, chromium or copper, a multi-layer formed by any combinations of the above metals, or a single layer or multi-layer formed of other metallic materials. The active layer 7 may comprise a semiconductor layer and an ohmic contact layer. The semiconductor layer may be formed of a-Si (amorphous silicon) or any other semiconductor materials. The ohmic contact layer may be formed of $n^+$ a-Si (doped amorphous silicon) or any other doped semiconductor materials. The common electrode 2 and the pixel electrode 10 may be formed of indium-tin oxide or indium-zinc oxide.

The present embodiment further provides a method for manufacturing the array substrate. The method is completed by six patterning processes and comprises the following steps in detail.

In step 1, the common electrode 2 is formed by depositing a first transparent conductive film on the substrate 1 and then performing a first patterning process on the first transparent conductive film.

In step 2, the insulating layer 3 is formed by depositing an insulating film on the resultant structure of the step 1 and performing a second patterning process on the insulating film, wherein the insulating layer 3 covers the common electrode 2 and the substrate 1, and the first through hole 11 is formed in the portion of the insulating layer 3 on the common electrode 2;

In step 3, the gate electrode 4 and the common electrode line 5 are formed on the insulating layer 3 by depositing a gate electrode metallic film on the resultant structure of the step 2 and performing a third patterning process on the gate electrode metallic film, wherein the common electrode line 5 is provided on the first through hole 11, and the common electrode line 5 is connected with the common electrode 2 through the first through hole 11;

In step 4, the gate electrode protection layer 6, the active layer 7, the source electrode 8a and the drain electrode 8b are formed by sequentially depositing a gate electrode protection film, a semiconductor film, an ohmic contact film and a drain-source metallic film on the resultant structure of the step 3 and performing a fourth patterning process with a halftone mask or a gray-tone mask, wherein the gate electrode protection layer 6 completely covers the gate electrode 4, the common electrode line 5 and the insulating layer 3, and the active layer 7, the source and drain electrodes 8a and 8b are located on the gate electrode protection layer 6 above the gate electrode 4;

In step 5, the passivation layer 9 is formed by depositing another insulating film on the resultant structure of the step 4 and performing a fifth patterning process on the another insulating film, wherein the passivation layer 9 completely covers the source and drain electrodes 8a and 8b and the gate electrode protection layer 6, and the second through hole 12 is formed in the portion of the passivation layer 9 on the drain electrode 8b;

In step 6, the pixel electrode 10 is formed by depositing a second transparent conductive film on the resultant structure of the step 5 and performing a sixth patterning process on the second transparent conductive film, wherein the pixel electrode 10 is connected with the drain electrode 8b through the second through hole 12.

Embodiment 2

Figure 3:
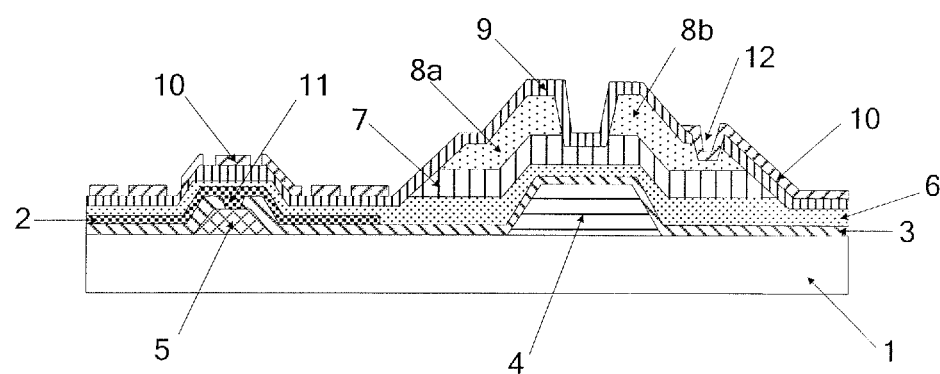
FIG. 3 is a schematic structural view of an array substrate in an embodiment 2 of the invention.

As shown in FIG. 3, in the present embodiment, the array substrate comprises: a substrate 1; a gate electrode 4 and a common electrode line 5 formed on the substrate 1, wherein the common electrode line 5 is disposed in a same layer as the gate electrode 4; an insulating layer 3 formed on the substrate 1 and covering the gate electrode 4 and the common electrode line 5, wherein a portion of the insulating layer 3 covering the common electrode line 5 has a first through hole 11, the first through hole is provided on the common electrode line 5; a common electrode 2 formed on the insulating layer 3, wherein the common electrode 2 is provided on the first through hole 11 and the common electrode 2 is connected with the common electrode line 5 through the first through hole 11; a gate electrode protection layer 6 completely covering the common electrode 2 and the insulating layer 3; an active layer 7 formed on the gate electrode protection layer 6 above the gate electrode 4; a source electrode 8a and a drain electrode 8b formed on the active layer 7; a passivation layer 9 covering the source and drain electrodes 8a and 8b and the gate electrode protection layer 6, wherein a second through hole 12 is formed in a portion of the passivation layer 9 covering the drain electrode 8b; and a pixel electrode 10 formed on the passivation layer 9, wherein the pixel electrode 10 has slits formed therein and the pixel electrode 10 is electrically connected with the drain electrode 8b through the second through hole 12. It can be seen from FIG. 3 that the common electrode 2 and the pixel electrode 10 are insulated from each other, and the insulating layer 3 is located between the gate electrode 4 and the common electrode 2 to isolate the gate electrode 4 from the common electrode 2.

The first through hole 11 and the second through hole 12 are preferably formed by a dry etching process.

Materials for forming each film provided in the array substrate according to the present embodiment are the same as those according to the embodiment 1, and the details thereof are omitted here.

The present embodiment further provides a method for manufacturing the array substrate. The method is performed by six patterning processes and comprises the following steps in detail.

In step 1, the gate electrode 4 and the common electrode line 5 are formed by depositing a gate electrode metallic film on the substrate 1 and performing a first patterning process on the gate electrode metallic film;

In step 2, the insulating layer 3 is formed by depositing an insulating film on the resultant structure of the step 1 and performing a second patterning process on the insulating film, wherein the insulating layer 3 covers the common electrode line 5 and the gate electrode 4, and the first through hole 11 is formed in a portion of the insulating layer 3 on the common electrode line 5;

In step 3, the common electrode 2 is formed by depositing a first transparent conductive film on the resultant structure of the step 2 and performing a third patterning process on the first transparent conductive film, wherein the common electrode 2 is provided on the first through hole 11, and the common electrode 2 is connected with the common electrode line 5 through the first through hole 11;

Steps 4~6 are the same as those in the embodiment 1, which will not be described in detail herein.

Embodiment 3

Figure 4:
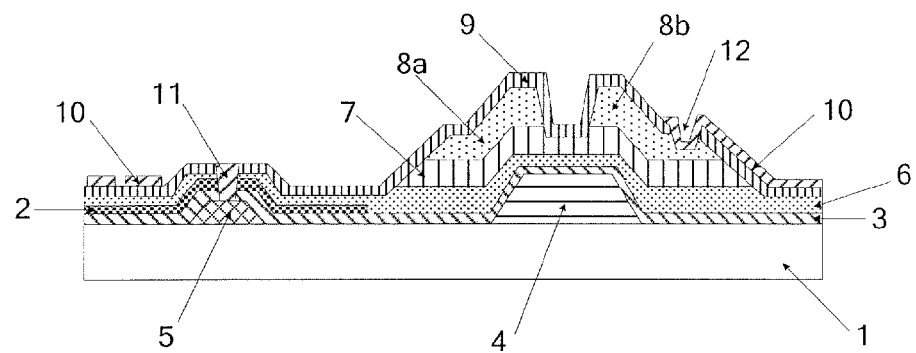
FIG. 4 is a schematic structural view of an array substrate in an embodiment 3 of the invention.

As shown in FIG. 4, in the present embodiment, the array substrate comprises: a substrate 1; a gate electrode 4 and a common electrode line 5 formed on the substrate 1, wherein the common electrode line 5 is disposed in a same layer as the gate electrode 4; an insulating layer 3 formed on the substrate 1 and covering the gate electrode 4 and the common electrode line 5; a common electrode 2 formed on the insulating layer 3, wherein the common electrode 2 is provided above the common electrode line 5; a gate electrode protection layer 6 completely covering the common electrode 2 and the insulating layer 3; an active layer 7 formed on the gate electrode protection layer 6 above the gate electrode 4; a source electrode 8a and a drain electrode 8b formed on the active layer 7; a passivation layer 9 covering the source and drain electrodes 8a and 8b and the gate electrode protection layer 6, wherein a second through hole 12 is formed in a portion of the passivation layer 9 on the drain electrode 8b; a first through hole 11 disposed above the common electrode line 5, wherein the first through hole 11 sequentially penetrates through the passivation layer 9, the gate electrode protection layer 6, the common electrode 2 and the insulating layer 3, and the common electrode 2 is connected with the common electrode line 5 through the first through hole 11; and a pixel electrode 10 formed on the passivation layer 9, wherein the pixel electrode 10 has slits formed therein and the pixel electrode 10 is electrically connected with the drain electrode 8b through the second through hole 12. It can be seen from FIG. 4 that the common electrode 2 and the pixel electrode 10 are insulated from each other, and the insulating layer 3 is located between the gate electrode 4 and the common electrode 2 to isolate the gate electrode 4 from the common electrode 2.

The first through hole 11 and the second through hole 12 are preferably formed by a dry etching process.

Materials for forming each film provided in the array substrate according to the present embodiment are the same as that according to the embodiment 1, and the details thereof are omitted here.

The present embodiment further provides a method for manufacturing the array substrate. The method is performed by five patterning processes and comprises the following steps in detail.

In step 1, the gate electrode 4 and the common electrode line 5 are formed by depositing a gate electrode metallic film on the substrate 1 and performing a first patterning process on the gate electrode metallic film;

In step 2, the insulating layer 3 and the common electrode 2 are formed by sequentially depositing an insulating film and a first transparent conductive film on the resultant structure of the step 1 and performing a second patterning process, wherein the insulating layer 3 is provided on the substrate 1 and covers the common electrode line 5 and the gate electrode 4, and the common electrode 2 is provided above the common electrode line 5.

In step 3, the gate electrode protection layer 6, the active layer 7, and the source and drain electrodes 8a and 8b are formed by sequentially depositing a gate electrode protection film, a semiconductor film, an ohmic contact film and a drain-source metallic film on the resultant structure of the step 2 and performing a third patterning process with a halftone mask or a gray-tone mask, wherein the gate electrode protection layer 6 completely covers the common electrode 2 and the insulating layer 3, and the active layer 7, the source electrode 8a and the drain electrode 8b are located on the gate electrode protection layer 6 above the gate electrode 4;

In step 4, the passivation layer 9 is formed by depositing another insulating film on the resultant structure of the step 3 and performing a fourth patterning process on the another insulating film, wherein the passivation layer 9 completely covers the source electrode 8a, the drain electrode 8b and the gate electrode protection layer 6, the second through hole 12 is formed in the portion of the passivation layer 9 on the drain electrode 8b, that is, the second through hole 12 penetrates through the passivation layer 9 to expose the drain electrode 8b, and the first through hole 11 penetrating through the passivation layer 9, the gate electrode protection layer 6, the common electrode 2 and the insulating layer 3 is also formed in this step to expose the common electrode line 5;

In step 5, the pixel electrode 10 is formed by depositing a second transparent conductive film on the resultant structure of the step 4 and performing a fifth patterning process on the second transparent conductive film, wherein the pixel electrode 10 is connected with the drain electrode 8b through the second through hole 12, and a portion of the second transparent conductive film deposited in the first through hole 11 causes the common electrode 2 to be connected with the common electrode line 5 through the first through, hole 11.

Embodiment 4

Figure 5:
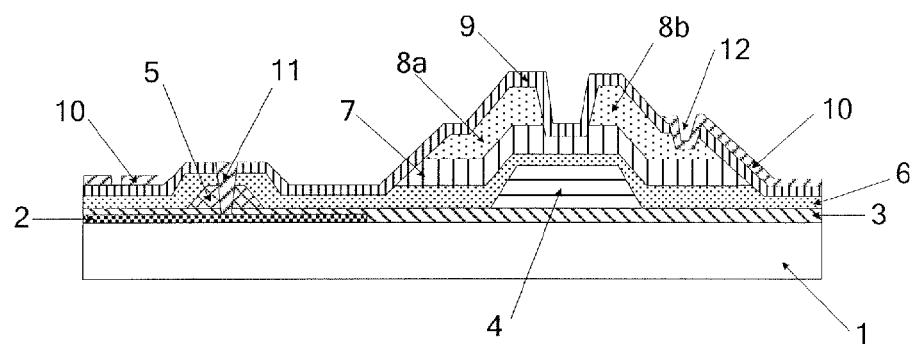
FIG. 5 is a schematic structural view of an array substrate in an embodiment 4 of the invention.

As shown in FIG. 5, in the present embodiment, the array substrate comprises: a substrate 1; a common electrode 2 formed on the substrate 1; an insulating layer 3 formed on the substrate 1 and covering the common electrode 2; a gate electrode 4 and a common electrode line 5 formed on the insulating layer 3, wherein the common electrode line 5 is disposed in a same layer as the gate electrode 4, and the common electrode line is provided above the common electrode 2; a gate electrode protection layer 6 completely covering the gate electrode 4, the common electrode line 5 and the insulating layer 3; an active layer 7 formed on the gate electrode protection layer 6 above the gate electrode 4; a source electrode 8a and a drain electrode 8b formed on the active layer 7; a passivation layer 9 covering the source and drain electrodes 8a and 8b and the gate electrode protection layer 6, wherein a second through hole 12 is formed in a portion of the passivation layer 9 on the drain electrode 8b; a first through hole 11 disposed above the common electrode 2, wherein the first through hole 12 sequentially penetrates through the passivation layer 9, the gate electrode protection layer 6, the common electrode line 5 and the insulating layer 3, and the common electrode 2 is electrically connected with the common electrode line 5 through the first through hole 11; and a pixel electrode 10 formed on the passivation layer 9, wherein the pixel electrode 10 has slits formed therein and the pixel electrode 10 is electrically connected with the drain electrode 8b through the second through hole 12. It can be seen from FIG. 5 that the common electrode 2 and the pixel electrode 10 are insulated from each other, and the insulating layer 3 is located between the gate electrode 4 and the common electrode 2 to isolate the gate electrode 4 from the common electrode 2.

The first through hole 11 and the second through hole 12 are preferably formed by a dry etching process.

Materials for forming each film provided in the array substrate according to the present embodiment are the same as that according to the embodiment 1, and the details thereof are omitted here.

The present embodiment further provides a method for manufacturing the array substrate. The method is performed by five patterning processes and comprises the following steps in detail.

In step 1, the common electrode 2 is formed by depositing a first transparent conductive film on the substrate 1 and then performing a first patterning process on the first transparent conductive film.

In step 2, the insulating layer 3, the gate electrode 4 and the common electrode line 5 are formed by sequentially depositing an insulating film and a gate electrode metallic film on the resultant structure of the step 1 and performing a second patterning process, wherein the insulating layer 3 is provided on the substrate 1 and covers the common electrode 2, and the common electrode line 5 is disposed above the common electrode 2;

In step 3, the gate electrode protection layer 6, the active layer 7, the source electrode 8a and the drain electrode 8b are formed by sequentially depositing a gate electrode protection film, a semiconductor film, an ohmic contact film and a drain-source metallic film on the resultant structure of the step 2 and performing a third patterning process with a halftone mask or a gray-tone mask, wherein the gate electrode protection layer 6 completely covers the gate electrode 4, the common electrode line 5 and the insulating layer 3, and the active layer 7, the source and drain electrode 8a and 8b are located on the gate electrode protection layer 6 above the gate electrode 4;

In step 4, the passivation layer 9 is formed by depositing another insulating film on the resultant structure of the step 3 and performing a fourth patterning process on the another insulating film, wherein the passivation layer 9 completely covers the source electrode 8a, the drain electrode 8b and the gate electrode protection layer 6, the second through hole 12 is formed in the portion of the passivation layer 9 on the drain electrode 8b, that is, the second through hole 12 penetrates through the passivation layer 9 to expose the drain electrode 8b, and the first through hole 11 penetrating through the passivation layer 9, the gate electrode protection layer 6, the common electrode line 5 and the insulating layer 3 is also formed in this step to expose the common electrode 2;

In step 5, the pixel electrode 10 is formed by depositing a second transparent conductive film on the resultant structure of the step 4 and performing a fifth patterning process on the second transparent conductive film, wherein the pixel electrode 10 is connected with the drain electrode 8b through the second through hole 12, and a portion of the second transparent conductive film deposited in the first through hole 11 causes the common electrode 2 to be connected with the common electrode line 5 through the first through hole 11.

The foregoing embodiments merely are exemplary embodiments of the invention, and not intended to define the scope of the invention, and the scope of the invention is determined by the appended claims.

What is claimed is:

1. An array substrate, comprising:
    a substrate;
    a common electrode and a pixel electrode sequentially formed on the substrate and insulated from each other;
    a thin film transistor comprising a gate electrode, an active layer, a source electrode and a drain electrode, wherein the drain electrode is electrically connected with the pixel electrode; and
    a common electrode line disposed in a same layer as the gate electrode;
    wherein the array substrate further comprises an insulating layer between the gate electrode and the common electrode to isolate the gate electrode from the common electrode, and the common electrode is connected with the common electrode line through a first through hole, and
    wherein the common electrode line and the gate electrode are provided on the substrate, the insulating layer is provided on the substrate and covers the common electrode line and the gate electrode, the common electrode is provided on the insulating layer, a portion of the insulating layer covering the common electrode line has the first through hole.

2. The array substrate according to claim 1, further comprising a passivation layer covering the source electrode and the drain electrode, wherein
    a second through hole penetrates through the passivation layer, and the drain electrode is electrically connected with the pixel electrode through the second through hole.

3. The array substrate according to claim 1, wherein the insulating layer is made of an insulating material with high light transmittance.

4. A display apparatus comprises the array substrate according to claim 1.

5. An array substrate, comprising:
    a substrate;
    a common electrode and a pixel electrode sequentially formed on the substrate and insulated from each other;
    a thin film transistor comprising a gate electrode, an active layer, a source electrode and a drain electrode, wherein the drain electrode is electrically connected with the pixel electrode; and
    a common electrode line disposed in a same layer as the gate electrode;
    wherein the array substrate further comprises an insulating layer between the gate electrode and the common electrode to isolate the gate electrode from the common electrode, and the common electrode is connected with the common electrode line through a first through hole, and wherein
    the common electrode line and the gate electrode are provided on the substrate, the insulating layer is provided on the substrate and covers the common electrode line and the gate electrode, the common electrode is provided on the insulating layer above the common electrode line;
    the array substrate further comprises a gate electrode protection layer covering the common electrode and the insulating layer;
    the active layer is provided on the gate electrode protection layer above the gate electrode;
    the source electrode and the drain electrode are provided on the active layer;
    the array substrate further comprises a passivation layer covering the source electrode, the drain electrode and the gate electrode protection layer; and
    the first through hole is provided above the common electrode line and sequentially penetrates through the passivation layer, the gate electrode protection layer, the common electrode and the insulating layer.

6. The array substrate according to claim 5, further comprising a passivation layer covering the source electrode and the drain electrode, wherein
    a second through hole penetrates through the passivation layer, and the drain electrode is electrically connected with the pixel electrode through the second through hole.

7. The array substrate according to claim 5, wherein the insulating layer is made of an insulating material with high light transmittance.

8. A display apparatus comprises the array substrate according to claim 5.

* * * * *